United States Patent
Itai et al.

(10) Patent No.: US 7,935,433 B2
(45) Date of Patent: May 3, 2011

(54) ORGANIC EL ELEMENT, ORGANIC EL DISPLAY APPARATUS, METHOD FOR MANUFACTURING ORGANIC EL ELEMENT, AND APPARATUS FOR MANUFACTURING ORGANIC EL ELEMENT

(75) Inventors: Yuichiro Itai, Kanagawa (JP); Tasuku Satoh, Kanagawa (JP); Yoshiaki Sakamoto, Kanagawa (JP); Toshiro Takahashi, Kanagawa (JP); Masaru Kinoshita, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 1042 days.

(21) Appl. No.: 10/584,413

(22) PCT Filed: Dec. 25, 2003

(86) PCT No.: PCT/JP03/16780
§ 371 (c)(1),
(2), (4) Date: Apr. 25, 2007

(87) PCT Pub. No.: WO2005/064994
PCT Pub. Date: Jul. 14, 2005

(65) Prior Publication Data
US 2008/0038583 A1 Feb. 14, 2008

(51) Int. Cl.
*B23B 9/00* (2006.01)
(52) U.S. Cl. .................................. 428/690; 313/504
(58) Field of Classification Search .................. None
See application file for complete search history.

(56) References Cited

U.S. PATENT DOCUMENTS

| 6,558,219 B1 | 5/2003 | Burroughes et al. |
|---|---|---|
| 2002/0028349 A1 | 3/2002 | Seo |
| 2002/0081372 A1 | 6/2002 | Peng |
| 2003/0118866 A1* | 6/2003 | Oh et al. ............... 428/690 |
| 2005/0037234 A1* | 2/2005 | Kim et al. ............... 428/690 |
| 2005/0106419 A1 | 5/2005 | Endoh et al. |
| 2005/0110009 A1 | 5/2005 | Blochwitz-Nimoth et al. |
| 2005/0236973 A1 | 10/2005 | Leo et al. |

FOREIGN PATENT DOCUMENTS

| JP | 4-297076 A | 10/1992 |
|---|---|---|
| JP | 7-230881 A | 8/1995 |
| JP | 8-31574 A | 2/1996 |

(Continued)

OTHER PUBLICATIONS

Zhou et. al., Enhanced Hole Injection . . . , 2001, Advance Functional Materials, vol. 11, No. 4, pp. 310-314.*

(Continued)

*Primary Examiner* — D. Lawrence Tarazano
*Assistant Examiner* — Gregory Clark
(74) *Attorney, Agent, or Firm* — Birch, Stewart, Kolasch & Birch, LLP

(57) ABSTRACT

An object of the present invention is to enable suppression of a leak current of an organic EL element while improving a conductivity of the organic EL element and suppressing an operation voltage thereof. An organic EL element is used which comprises at least a luminescent layer, a hole transport layer adjacent to a positive-electrode side of the luminescent layer, and an electron injection transport layer adjacent to a negative-electrode side of the luminescent layer, wherein a hole injection layer is provided between the hole transport layer and the positive electrode, and the conductivity of the hole injection layer continuously changes along a thickness direction of the hole injection layer.

17 Claims, 12 Drawing Sheets

FOREIGN PATENT DOCUMENTS

| | | |
|---|---|---|
| JP | 2000-196140 A | 7/2000 |
| JP | 2000-260572 A | 9/2000 |
| JP | 2001-254076 A | 9/2001 |
| JP | 2002-141173 A | 5/2002 |
| JP | 2002-151259 A | 5/2002 |
| JP | 2002-196140 A | 7/2002 |
| JP | 2003-68468 A | 3/2003 |
| JP | 2003-77662 A | 3/2003 |
| JP | 2003-229264 A | 8/2003 |
| JP | 2003-229278 A | 8/2003 |
| JP | 2003-257664 A | 9/2003 |
| JP | 2003-321403 A | 11/2003 |
| JP | 2005-72012 A | 3/2005 |
| JP | 2005-166641 A | 6/2005 |
| JP | 2005-524956 A | 8/2005 |
| WO | WO 01/72962 | 10/2001 |
| WO | WO 02/16429 | 2/2002 |
| WO | WO 02/26822 | 4/2002 |
| WO | WO-03/083958 A2 | 10/2003 |

OTHER PUBLICATIONS van Duren et. al., In-Situ Compositional . . . , 2002, Advanced Functional Materials, vol. 12, No. 12, pp. 665-669.*

C.W. Tang et al., Applied Physics Letters, vol. 51, No. 12, Sep. 21, 1987, pp. 913-915.

Notice of Reasons for Rejection issued Aug. 11, 2009, in corresponding Japanese Application No. 2005-512796.

Notice of Reasons for Rejections issued Oct. 20, 2009, in corresponding Japanese Application No. 2005-512796.

* cited by examiner

FIG.5

| | LEAK CURRENT (MAX VALUE) | LUMINOUS INTENSITY (cd/m2) | | VOLTAGE (V) | | LUMINOUS EFFICIENCY (lm/W) | |
|---|---|---|---|---|---|---|---|
| | 0~15V | 1mA/cm$^2$ | 15mA/cm$^2$ | 1mA/cm$^2$ | 15mA/cm$^2$ | 1mA/cm$^2$ | 15mA/cm$^2$ |
| COMPARATIVE EXAMPLE 1 | 359 μA | 76 | 1064 | 3.55 | 5.22 | 6.76 | 4.27 |
| EXAMPLE 1 | 33.4 μA | 77 | 995 | 3.50 | 5.13 | 6.95 | 4.06 |
| EXAMPLE 2 | 82.2 μA | 76 | 1048 | 3.53 | 5.17 | 6.79 | 4.25 |
| EXAMPLE 3 | 18.1 μA | 80 | 1099 | 3.57 | 5.28 | 7.0 | 4.36 |

100A

|  | Luminous Intensity (cd/m$^2$) | Half-Life (hr) |
|---|---|---|
| First | 250 | 750 |
| Second | 209 | 650 |
| Third | 224 | 710 |
| Fourth | 234 | 710 |
| Fifth | 205 | 670 |
| Maximum Variation | 11.40% | 7.45% |

|  | Luminous Intensity (cd/m$^2$) | Half-Life (hr) |
|---|---|---|
| First | 227 | 700 |
| Second | 220 | 710 |
| Third | 225 | 710 |
| Fourth | 229 | 710 |
| Fifth | 232 | 690 |
| Maximum Variation | 3.02% | 1.71% |

α-NPD

Alq3

2-TNATA tbppy

CBP

BCP

ORGANIC EL ELEMENT, ORGANIC EL DISPLAY APPARATUS, METHOD FOR MANUFACTURING ORGANIC EL ELEMENT, AND APPARATUS FOR MANUFACTURING ORGANIC EL ELEMENT

TECHNICAL FIELD

The present invention relates to an organic EL element, an organic EL element display apparatus, a method for manufacturing an organic element, and an apparatus for manufacturing an organic EL element.

RELATED ART

In recent years, a flat display apparatus whose thickness can be reduced has been increasingly put into practical use in place of conventionally used CRT (Cathode Ray Tube). An organic electroluminescence element, which is characterized in its self-luminous property and high-speed response (hereinafter, referred to as organic EL element in this specification), has been attracting attention as a next-generation display apparatus.

The organic EL element has a structure where an organic EL layer, which is a luminescent layer, is sandwiched between a positive electrode and a negative electrode. In the structure, holes are injected into the organic EL layer from the positive electrode and electrons are injected thereinto from the negative electrode, and the organic EL layer emits light through recombination of the injected holes and electrons.

It is known that the optical output is decreased and the drive voltage is increased over time when the organic EL element is used for a long time, and the organic EL layer is ultimately short-circuited and destroyed when the operation thereof is further continued. Possible causes for the destruction are crystallization of the organic EL element, accumulation of space charges resulting from the crystallization, and a change in the property of the element in terms of its potential due to dielectric polarization. Further, it is assumed that deterioration of the electrodes due to oxidation is also a cause for the destruction.

In order to improve a life of the organic EL element, it is important to suppress the operation voltage while maintaining the luminous efficiency and the light intensity, that is, to increase the efficiency of the organic EL element. The suppression of the operation voltage also leads to suppression of power consumption of the organic EL element.

In an early stage of the development of the organic EL element, the organic EL element had a simple structure comprising positive electrode/luminescent layer (organic EL layer)/negative electrode. However, a so-called multilayer organic EL element comprising, for example, positive electrode/hole transport layer/luminescent layer/electron transport layer/negative electrode has been proposed in order to increase the efficiency of the organic EL element (for example, see the Non-Patent Document 1).

So far were proposed a method in which a hole injection layer formed from 2-TNATA or the like is provided between the positive electrode and the hole transport layer so that the operation voltage of the organic EL element can be reduced in order to increase the amount of the holes injected from the positive electrode (see the Patent Document 1), and a method in which an acceptor is doped in the hole transport layer in order to increase the conductivity of the hole transport layer so that the operation voltage of the organic EL element can be reduced and the efficiency of the organic EL element was thereby increased (see the Patent Document 2).

In the foregoing case where the acceptor is doped in the hole transport layer, the conductivity is improved; however, there is a problem in that a current flow is generated upon application of voltage in the negative direction owing to insufficient confinement of the carriers, in other words, a leak current is generated. Toward the problem, a method has been proposed (see the Patent Document 3) in which the leak current is suppressed while improving the conductivity and the luminous efficiency by further providing an electron injection suppression layer for confining the electrons.

[Patent Document 1] Japanese Patent Application Laid-Open (JP-A) No. 2001-254076
[Patent Document 2] JP-A No. 04-297076
[Patent Document 3] JP-A No. 2002-196140

However, the leak current cannot be sufficiently suppressed in any of the foregoing organic EL elements. The leak current flow generated by the voltage application in the negative direction may cause, for example, the generation of crosstalk as described below.

FIG. 1A schematically shows a structure of an organic EL display apparatus in which an organic EL element is used. FIG. 1B is an equivalent circuit diagram of the organic EL display apparatus.

Referring to FIGS. 1A and 1B, a current flows along a path E1 when a voltage is applied to an element a in order to drive the element a, in which case it is assumed that the current also flows along a path E2. In this case, when the leak current generated by a voltage in a negative direction is large in an element b, crosstalk is generated in the element b. In the case where the leak current is large owing to insufficient confinement of the electrons, there is a problem in that the luminous efficiency is decreased because the proportion of the electrons contributing to light emission is reduced.

Thus, it was difficult to suppress the leak current while improving the conductivity of the organic EL element and suppressing the operation voltage thereof in the conventional organic EL element.

Therefore, an object of the present invention is to provide a novel and useful organic EL element, an organic EL display apparatus, a method and a apparatus for manufacturing the organic EL element, which solve the foregoing problems.

Specific problems solved by the present invention are to enable suppression of the leak current of the organic EL element while improving the conductivity of the organic EL element and suppressing the operation voltage, and to provide an organic EL display apparatus in which the organic EL element is used, and a method and a apparatus for manufacturing the organic EL element.

DISCLOSURE OF THE INVENTION

In order to solve the foregoing problems, an organic EL element according to the present invention comprises, between a positive electrode and a negative electrode, at least a luminescent layer, a hole transport layer adjacent to the positive-electrode side of the luminescent layer, and an electron injection transport layer adjacent to the negative-electrode side of the luminescent layer, wherein a hole injection layer is formed between the hole transport layer and the positive electrode, and the electric conductivity of the hole injection layer varies continuously in a thickness direction of the hole injection layer.

In the organic EL element, the hole injection layer is formed to continuously change its conductivity in the thickness direction of the hole injection layer. Therefore, a region where carriers are depleted is formed in the hole injection layer. As a result, the leak current of the organic EL element can be suppressed while the conductivity of the organic EL element is improved and the operation voltage of the organic EL element is suppressed.

An organic EL display apparatus according to the invention comprises an organic EL element comprising, between a positive electrode and a negative electrode, at least a luminescent layer, a hole transport layer adjacent to the positive-electrode side of the luminescent layer, and an electron injection transport layer adjacent to the negative-electrode side of the luminescent layer, wherein a hole injection layer is formed between the hole transport layer and the positive electrode, and the electric conductivity of the hole injection layer varies continuously in a thickness direction of the hole injection layer.

In the organic EL display apparatus, the hole injection layer is formed to continuously change its conductivity in the thickness direction of the hole injection layer. Therefore, a region where the concentration of the carrier is reduced is formed in the hole injection layer. As a result, the leak current of the organic EL element can be suppressed while the conductivity of the organic EL element is improved and the operation voltage is suppressed, and further, an effect of suppression of crosstalk is also achieved.

A method of manufacturing an organic EL element according to the invention comprises a step of forming a hole injection layer on a positive electrode formed on a substrate, a step of forming a hole transport layer on the hole injection layer, a step of forming a luminescent layer on the hole transport layer, a step of forming an electron injection transport layer on the luminescent layer, and a step of forming a negative electrode on the electron injection transport layer, wherein the step of forming the hole injection layer is conducted by a vacuum deposition method using a deposition source, and the step of forming the hole injection layer includes a step of changing the distance between the deposition source and the substrate to be processed on which the organic EL element is to be formed.

In the method of manufacturing an organic EL element, which includes the step of changing the distance between the deposition source and the substrate to be processed on which the organic EL element is to be formed, a film in which the material introduced into the hole injection layer is varied in the film-thickness direction of the hole injection layer can be formed.

An apparatus for manufacturing an organic EL element according to the invention comprises a processing vessel, an exhaust unit for exhausting air from the processing vessel, a retaining table for retaining a substrate to be processed provided in the processing vessel on a first side thereof, and an deposition source for vaporizing a material provided in the processing vessel on a second side thereof facing the first side, wherein the material vaporized by the deposition source is deposited on the substrate to be processed, the apparatus further comprising a moving unit for moving the vaporizing unit inside the processing vessel, the moving unit at least being capable of moving the deposition source in a direction from the first side toward the second side or in a direction from the second side toward the first side.

According to the apparatus for manufacturing an organic EL element, the deposition source is moved in the direction from the first side toward the second side or in the direction from the second side toward the first side when an organic layer of the organic EL element is formed, whereby effects of improving the reproducibility of the thickness of the obtained film and of improving the reproducibility of the concentrations of components added to the film can be obtained.

BRIEF DESCRIPTION OF THE DRAWINGS

FIG. 5 shows characteristics of the organic EL elements in which the hole injection layers shown in FIGS. 4A to 4C are used.

BEST MODE FOR CARRYING OUT THE INVENTION

Hereinafter, embodiments of the present invention are described with reference to the drawings.

Figure 1A:
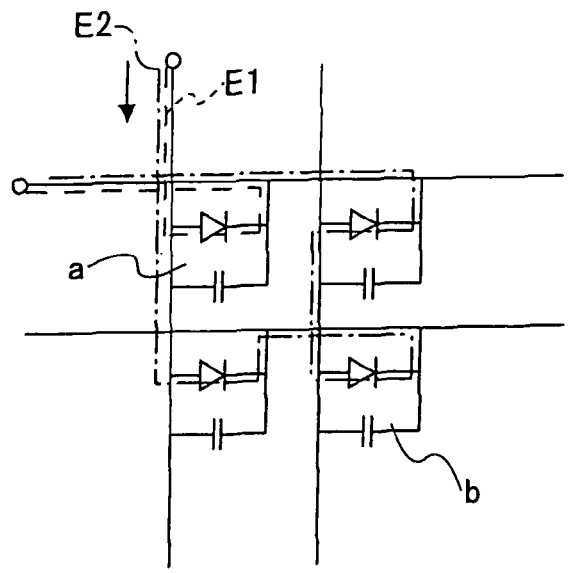
FIG. 1A is a schematic diagram of a conventional organic EL display apparatus.
Figure 1B:
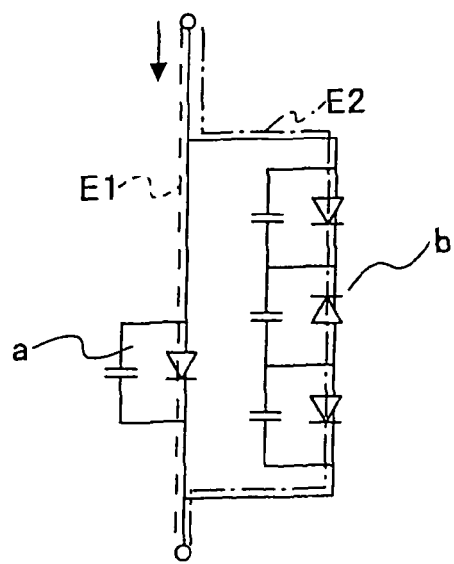
FIG. 1B is an equivalent circuit diagram of the organic EL display apparatus.
Figure 2:
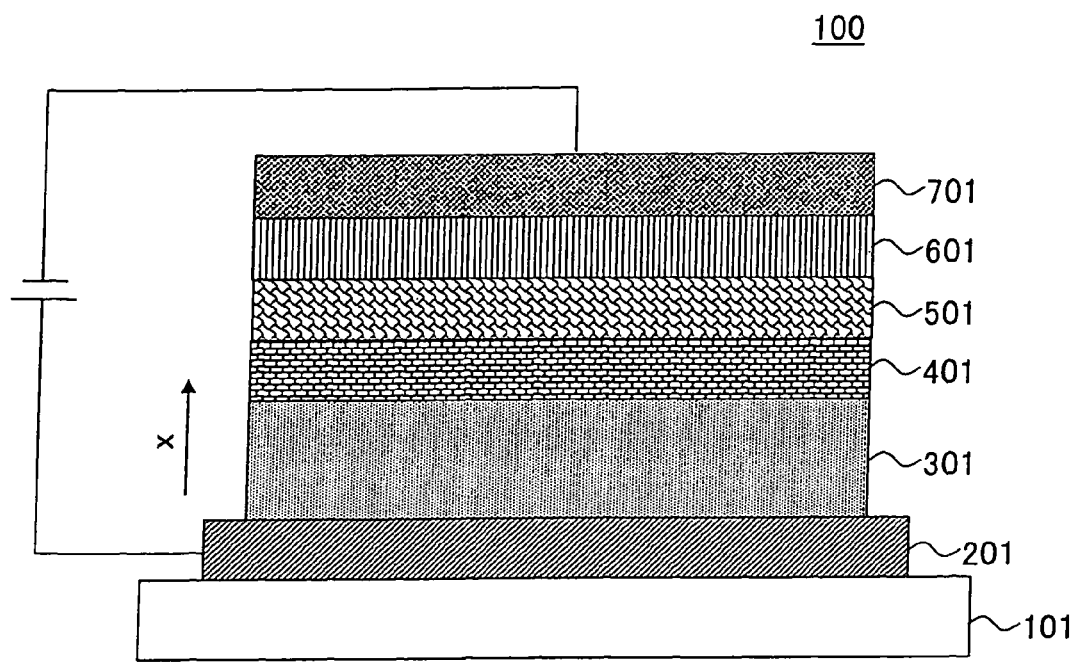
FIG. 2 is a sectional view schematically illustrating an organic EL element according to the present invention.

FIG. 2 is a view schematically illustrating the cross-section of an example of the constitution of an organic EL element according to the invention.

Referring to FIG. 2, an organic EL element 100 shown in FIG. 2 has a structure in which a positive electrode 201 formed from a transparent electrode, for example, ITO, is formed on a substrate 101 formed from, for example, glass, and a luminescent layer 501 composed of an organic EL layer is sandwiched between the positive electrode 201 and a negative electrode 701 formed from, for example, Al.

An electron injection transport layer 601 is formed between the luminescent layer 501 and the negative electrode 701, and a hole transport layer 401 is formed between the luminescent layer 501 and the positive electrode 201 such that the hole transport layer 401 contacts the luminescent layer 501. Further, a hole injection layer 301 is formed between the hole transport layer 401 and the positive electrode 201 such that the hole injection layer 301 contacts the hole transport layer 401 and the positive electrode 201.

In the organic EL element 100, a voltage is applied to between the negative electrode 701 and the positive electrode 201 in a forward direction so that electrons from the negative electrode 701 and holes from the positive electrode 201 are injected into the luminescent layer 501. The electrons and the holes recombine, so that the luminescent layer 501 emits light of a wavelength corresponding to an energy gap of the luminescent layer 501.

A material having a large work function, for example a conductive oxide, ITO, is used for the positive electrode 201, while a material having a small work function, for example Al—Li, is used for the negative electrode.

It is important to efficiently inject carriers into the luminescent layer 501 in order to increase a luminous efficiency of the luminescent layer 501. Since a large band level difference is generated between the positive electrode 201 and the luminescent layer 501, or between the negative electrode 701 and the luminescent layer 501, it is necessary to provide a layer for reducing the resistance of the element and efficiently infecting the carriers. In the present embodiment, the hole injection layer 301 and the electron injection transport layer 601 are provided.

In the present embodiment, an acceptor is introduced into the hole injection layer 301 so that its conductivity is increased, and holes are thereby efficiently injected into the luminescent layer 501 from the positive electrode 201.

In order to increase the luminous efficiency of the luminescent layer 501, however, it is important to confine the electrons and the holes within the luminescent layer 501 to further encourage the recombination thereof. For example, the leak current increases when many electrons pass through the luminescent layer without contributing to light emission, and the increase of the leak current results in decrease in the luminous efficiency.

Therefore, the layers which sandwich the luminescent layer 501 preferably have a function of efficiently injecting carriers into the luminescent layer 501 and also confining the carriers.

Therefor, the present embodiment provides the structure in which the hole transport layer 401 is provided and efficiently transports holes to the luminescent layer, and the energy barrier serving to confine the electrons within the luminescent layer is increased in height so as to increase the luminous efficiency by preventing electrons from the luminescent layer 501 from passing through to the positive electrode 201 side. Therefore, the hole transport layer 401 is referred to as an electron blocking layer in some cases.

In a conventional organic EL element in which the acceptor is simply introduced into the hole injection layer 301, however, it has been difficult to simultaneously achieve suppression of the operation voltage by reducing the resistance of the element and suppression of the leak current by maintaining the effect of trapping the carriers, as described below.

For example, some of the electrons injected into the luminescent layer 501 pass through the hole transport layer (electron blocking layer) 401, and it is difficult to completely prevent the passage of the electrons through the hole transport layer 401, i.e., so-called passing straight through.

In the conventional organic EL element, the leak current has been large because any electron having passed through the hole transport layer easily passes through the hole injection layer to finally reach the positive electrode, and it has been difficult, in particular, to control the problem in the increase of the leak current when the concentration of the acceptor is increased in order to increase the conductivity of the hole injection layer for the purpose of controlling the operation voltage.

In the case of the organic EL element 100 according to the present embodiment, the conductivity of the hole injection layer 301 continuously varies from a side of the hole injection layer 301 facing the positive electrode 201 to a side of the hole injection layer 301 facing the hole transport layer 401.

As a result, the leak current of the organic EL element can be suppressed while the conductivity of the organic EL element is improved and the operation voltage is suppressed. More specifically, a part achieving the effect of suppressing the operation voltage through improvement of the conductivity of the hole injection layer and a part achieving the effect of suppressing the leak current through reduction of the conductivity and blockage of the passage of the electrons are provided, so that the operation voltage and the leak current can be simultaneously suppressed.

For example, when the acceptor is doped in the hole injection layer 301, the conductivity can be controlled. However, the concentration of the acceptor is set to be changed continuously in the film-thickness direction of the hole injection layer 301, that is, in the direction from the positive electrode 201 to the hole transport layer 410, so that the part where the conductivity is increased and the part where the conductivity is reduced can be formed in the hole injection layer 301.

Figure 3A:
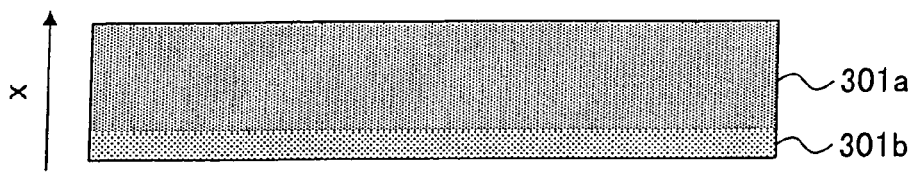
FIGS. 3A to 3C are sectional views schematically illustrating details of the hole injection layer of the organic EL element shown in FIG. 2.
Figure 3B:
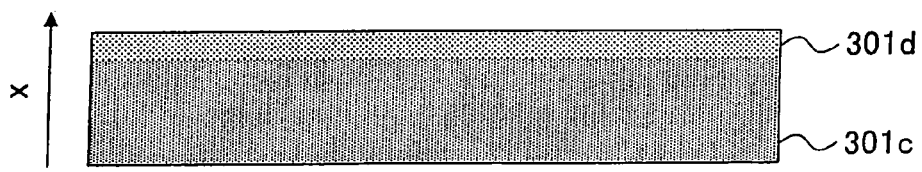
Figure 3C:
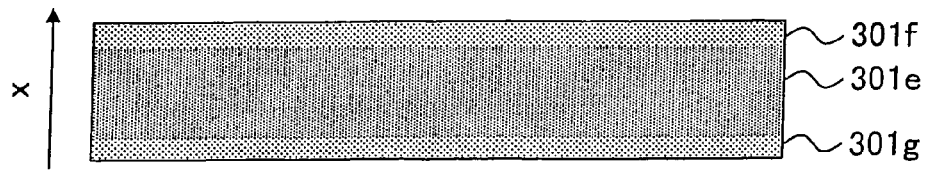

FIGS. 3A to 3C respectively show hole injection layers 301A to 301C, which are examples in which the conductivity of the hole injection layer 301 is thus changed in the organic EL element 100. As shown in FIG. 2, the direction from the positive electrode 201 toward the electron transport layer 401, that is, the film-thickness direction of the hole injection layer 301, is referred to as an x-axis direction.

In the case of the hole injection layer 301A shown in FIG. 3A, the hole injection layer 301A is formed such that the acceptor concentration of the hole injection layer 301A is lower in the vicinity of the positive electrode 201. In the hole injection layer 301A, a low-concentration layer 301b whose acceptor concentration is lower is formed on a side thereof facing the positive electrode 201, while a high-concentration layer 301a whose acceptor concentration is higher is formed between the low-concentration layer 301b and the hole transport layer 401. Therefore, the electrons having passed through the hole transport layer 401 are prevented from passing through the hole injection layer 301A by the low-concentration layer 301b, and further, the formation of the high-concentration layer 301a whose acceptor concentration is higher serves to maintain the conductivity of the hole injection layer 301A at high level so that the holes are efficiently injected into the luminescent layer. As a result, the operation voltage of the organic EL element is effectively suppressed.

The ITO used for the positive electrode 201 has a large film surface roughness, in other words, has a large unevenness on the film surface thereof. In particular, there has been a phenomenon in which the leak current is increased with a protruding portion serving as the initiating point. When the low-concentration layer having the lower acceptor concentration and lower conductivity is provided in the vicinity of the positive electrode as shown in the drawing, electric field concentration effect resulting from the surface roughness of the positive electrode and increase of the leak current resulting from the electric field concentration effect can also be suppressed.

In the case of the hole injection layer 301B shown in FIG. 3B, the acceptor concentration of the hole injection layer 301B is set to be lower in the vicinity of the hole transport layer 401. In the hole injection layer 301B, a low-concentration layer 301d whose acceptor concentration is lower is formed on a side thereof facing the hole transport layer 401, while a high-concentration layer 301c whose acceptor concentration is higher is formed between the low-concentration layer 301d and the positive electrode 201. Therefore, the electrons having passed through the hole transport layer 401 are prevented from passing through the hole injection layer 301B by the low-concentration layer 301d, and further, the formation of the high-concentration layer 301c whose acceptor concentration is higher serves to maintain the conductivity of the hole injection layer 301B at high level so that the holes are efficiently injected into the luminescent layer. As a result, the operation voltage of the organic EL element is suppressed.

Further, as in the case of the hole injection layer 301C shown in FIG. 3C, when the acceptor concentration of the hole injection layer 301C is set to be lower in both of the vicinity of the positive electrode 201 and the vicinity of the hole transport layer 401, the effect of suppressing the leak current is enhanced.

In the hole injection layer 301C, a low-concentration layer 301g whose acceptor concentration is lower is formed on a side thereof facing the positive electrode 201, and a low-concentration layer 301f whose acceptor concentration is lower is formed on a side thereof facing the hole transport layer 401, while a high-concentration layer 301e whose acceptor concentration is higher is formed between the low-concentration layer 301g and the low-concentration layer 301f.

Therefore, the electrons having passed through the hole transport layer 401 are prevented from passing through the hole injection layer 301C by the low-concentration layers 301f and 301g, and further, the formation of the high-concentration layer 301e whose acceptor concentration is higher serves to maintain the conductivity of the hole injection layer 301C at high level so that the holes are efficiently injected into the luminescent layer. As a result, the operation voltage of the organic EL element is suppressed.

Next, specific examples of the constitutions of the organic EL elements in which the hole injection layers shown in FIGS. 3A to 3C are used will be described with reference to FIGS. 4A to 4C.

Example 1

Figure 4A:
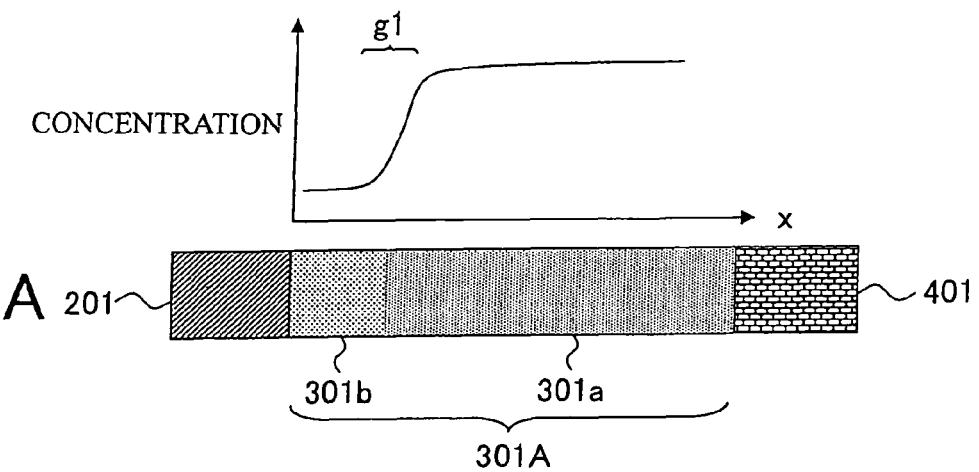
FIGS. 4A to 4C schematically illustrate the concentration of the acceptor in the hole injection layers shown in FIGS. 3A to 3C.

FIG. 4A shows an example in which the hole injection layer 301A shown in FIG. 3A is used as the hole injection layer in the organic EL element shown in FIG. 2. The accompanying graph schematically shows the concentration of the acceptor in the hole injection layer. In the drawing, the parts described above are represented by the same reference characters and the descriptions thereof are omitted. In the drawing, components other than the hole injection layer, the positive electrode and the hole transport layer are omitted, and the x-axis direction shown in this figure corresponds to the x-axis direction shown in FIG. 2 (the same holds true for FIGS. 4B to 4C).

In the example, a substrate formed from glass was used as the substrate 101, an ITO electrode was used as the positive electrode 201, 2-TNATA (4,4',4"-tris(2-naphthylphenyl amino)triphenylamine, manufactured by BANDO CHEMICAL INDUSTRIES, LTD) was used as the hole injection layer 301A, F4-TCNQ (2,3,5,6-tetrafluoro-7,7,8,8tetracyanoquinodimethane, manufactured by Sigma-Aldrich Japan K. K.) was used as the acceptor doped in the hole injection layer, α-NPD (N,N'-di(1-naphthyl)-N,N'-diphenyl-[1,1'-biphenyl]-4,4'-diamine, trade name TYE501, manufactured by TOYO INK MFG CO., LTD.) was used as the hole transport layer (electron suppression layer) 401, Alq (trade name TYE701, manufactured by TOYO INK MFG. CO., LTD.) as a host in which a light emitting material is doped was used as the luminescent layer 501, Alq was used as the electron transport layer 601, and Al—Li was used as the negative electrode 701.

As the acceptor, an inorganic material such as $FeCl_3$, $InCl_3$, $AsF_6$, Cl, Br or I, or an organic material, for example, a compound having a cyano group such as TCNQ(7,7,8,8-tetracyanoquinodimethan) or TCNE (tetracyanoethylene), or a compound having a nitro group such as TNF (trinitrofluorenone) or DNF (dinitrofluorenone) can also be used.

When the organic EL element shown in this example is formed, first, the glass substrate provided with the ITO was ultrasonically cleaned with water, acetone and isopropyl alcohol, and subjected to a UV ozone processing or an oxygen plasma processing. In the UV ozone processing, UV light was irradiated in atmosphere for 20 minutes.

Next, the following film was deposited on the ITO surface as the positive electrode with a vacuum deposition apparatus at a pressure of $1\times10^{-6}$ torr, the temperature of the substrate being at room temperature.

First, 2-TNANA and F4-TCNQ were deposited to a thickness of 10 nm (0.04%) at the deposition speeds of 0.1 nm/s and 0.00004 nm/s, respectively, so that the low-concentration layer 301b was formed. Further, 2-TNANA and F4-TCNQ were deposited to a thickness of 30 nm (0.12%) at the deposition speeds of 0.1 nm/s and 0.00012 nm/s, respectively, so that the high-concentration film 301a was formed.

α-NPD was deposited to a thickness of 10 nm at a deposition speed of 0.1 nm/s on the hole injection layer 301A formed as described above so that the hole transport layer 401 was formed.

Next, Alq doped with the light emitting material was deposited to a thickness of 30 nm so that the luminescent layer 501 was formed. Alq was further provided to a thickness of 20 nm on the luminescent layer as the electron injection transport layer 601. Then, Lif in a thickness of 0.5 nm and Al in a thickness of 100 nm were formed as the negative electrode so that an organic EL element was obtained.

When a voltage of 6V or higher was applied to the organic EL element thus formed with the ITO as the positive electrode and Al—Li as the negative electrode, emission of green light was observed.

FIG. 4A schematically illustrates the acceptor concentration in the x-axis direction, that is the film-thickness direction of the hole injection layer. It is shown that the acceptor concentration is lower in the low-concentration layer 301b, while the acceptor concentration is higher in the high-concentration layer 301a.

The hole injection layer thus constituted preferably has a thickness of 40 to 50 nm. The acceptor concentration is preferably set to change by at least 10% between the low-concentration layer 301b and the high-concentration layer 301a in the hole injection layer because the leak current can be thereby more effectively suppressed.

A concentration gradient of the acceptor at a boundary g1 which is a border between the low-concentration layer 301b and the high-concentration layer 301a preferably changes continuously, instead of a sharp change, showing a moderate gradient. This is because the life of the organic EL element is improved when the concentration gradient of the acceptor is set to be moderate. A manufacturing apparatus used for the formation of the organic layer having such a concentration variation and a concentration gradient will be described later.

Example 2

Figure 4B:
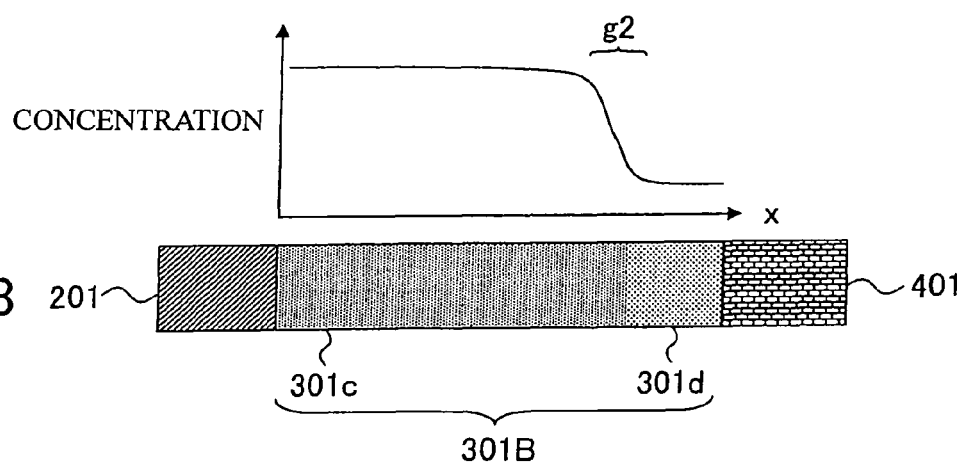

FIG. 4B shows the example in which the hole injection layer 301B shown in FIG. 3B is used as the hole injection layer in the organic EL element shown in FIG. 2. The accompanying graph schematically shows the concentration of the acceptor in the hole injection layer.

In this example, the structures of the substrate 101, the positive electrode 201, the hole transport layer (electron suppression layer) 401, the luminescent layer 501, the electron transport layer 601 and the negative electrode 701 are the same as in Example 1, and can be produced by the method described in Example 1.

In this example, similarly to Example 1, 2-TNATA was used as the hole injection layer 301B, and F4-TCNQ was used as the acceptor doped in the hole injection layer when the hole injection layer 301B is formed on the ITO surface as follows.

First, 2-TNANA and F4-TCNQ were deposited to a thickness of 30 nm (0.12%) at the deposition speed of 0.1 nm/s and 0.00012 nm/s, respectively, so that the high-concentration layer 301c was formed. Further, 2-TNANA and F4-TCNQ were deposited to a thickness of 10 nm (0.04%) at the deposition speeds of 0.1 nm/s and 0.00004 nm/s, respectively, so that the low-concentration film 301d was formed.

It is shown in FIG. 4B, which schematically illustrates the acceptor concentrations in the x-axis direction (that is the film-thickness direction of the hole injection layer), that the acceptor concentration is higher in the high-concentration layer 301c, while the acceptor concentration is lower in the low-concentration layer 301d.

The hole injection layer thus constituted preferably has a thickness of 40 to 50 nm. In the hole injection layer, the acceptor concentration is preferably set to change by at least 10% between the high-concentration layer 301c and the low-concentration layer 301d because the leak current can be thereby more effectively suppressed.

The concentration gradient of the acceptor at a boundary g2 which is a border between the high-concentration layer 301c and the low-concentration layer 301d preferably changes continuously, instead of a sharp change, showing a moderate gradient, for the same reason as in the case of the boundary g1 in Example 1.

Example 3

Figure 4C:
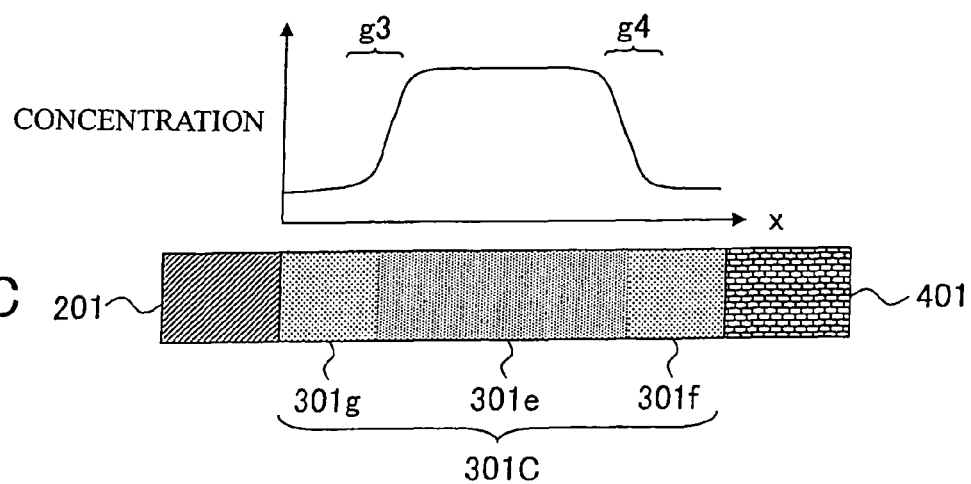

FIG. 4C shows an example in which the hole injection layer 301C shown in FIG. 3C is used as the hole injection layer in the organic EL element shown in FIG. 2. The accompanying graph schematically shows the acceptor concentration of the hole injection layer.

In this example, the structures of the substrate 101, the positive electrode 201, the hole transport layer (electron suppression layer) 401, the luminescent layer 501, the electron transport layer 601 made of Alq, and the negative electrode 701 are the same as in Example 1, and can be formed by the method described in Example 1.

In this example, similarly to Example 1, 2-TNATA was used as the hole injection layer 301C, and F4-TCNQ was used as the acceptor doped in the hole injection layer when the hole injection layer 301C was formed on the surface of the ITO as follows.

First, 2-TNANA and F4-TCNQ were deposited to a thickness of 10 nm (0.04%) at the deposition speeds of 0.1 nm/s and 0.00004 nm/s, respectively, so that the low-concentration layer 301g was formed. Further, 2-TNANA and F4-TCNQ were deposited to a thickness of 20 nm (0.16%) at the deposition speeds of 0.1 nm/s and 0.00016 nm/s, respectively, so that the high-concentration film 301e was formed. Thereafter, 2-TNANA and F4-TCNQ were deposited to a thickness of 10 nm (0.04%) at the deposition speeds of 0.1 nm/s and 0.00004 nm/s, respectively, so that the low-concentration film 301f was formed, whereby the hole injection layer 301C was formed.

It is shown in FIG. 4C, which schematically illustrates the acceptor concentrations in the x-axis direction (that is the film-thickness direction of the hole injection layer), that the acceptor concentration is higher in the high-concentration layer 301e, while the acceptor concentration is lower in the low-concentration layers 301g and 301f.

The hole injection layer thus constituted preferably has a thickness of 40 to 50 nm. In the hole injection layer, the acceptor concentration is preferably set to change by at least 10% between the low-concentration layer 301g and the high-concentration layer 301e because the leak current can be thereby more effectively suppressed. Further, the acceptor concentration is preferably set to change by at least 10% between the high-concentration layer 301e and the low-concentration layer 301f because the leak current can be thereby more effectively suppressed.

The acceptor concentration at a boundaries g3 and g4 which are borders between the low-concentration layer and the high-concentration layer preferably changes continuously, instead of a sharp change, showing a moderate gradient for the same reason as in the case of the boundary g1 in Example 1.

FIG. 5 shows the results of the comparison of the leak current, the luminous intensity, the operation voltage and the luminous efficiency in each of the organic EL elements of Examples 1 to 3 (in the case of using the hole injection layers 100A to 100C). As a comparative example, the results obtained by using a hole injection layer whose conductivity was substantially uniform within the layer are also shown. In the case of the comparative example, the hole injection layer was obtained by depositing 2-TNANA and F4-TCNQ to a thickness of 40 nm (0.1%) at the deposition speeds of 0.1 nm/s and 0.0001 nm/s, respectively, and, except for the hole injection layer, the constitution was the same as that of Examples 1 to 3.

Referring to FIG. 5, compared to the comparative example, it was confirmed that the leak current was more suppressed in Examples 1 to 3 than in the comparative example while the values of the luminous intensity, the operation voltage and the luminous efficiency in Examples 1 to 3 were maintained at an approximately similar level. More specifically, it was confirmed that the conventional problem that the leak current increases when the acceptor is doped has been suppressed while retaining the effects of increasing the luminous intensity and the luminous efficiency and of suppressing the operation voltage achieved by the doping of the acceptor into the hole injection layer.

In the case of Example 1, the leak current is further reduced as compared to Example 2. A probable reason for the further reduction is that the increase of the leak current resulting from the surface roughness of the ITO film used as the positive electrode 201 (that is, the unevenness of the film surface) can be suppressed as explained in the description of the hole injection layer 100A.

In the case of Example 3, the leak current is further reduced as compared to Examples 1 and 2. It was confirmed that the leak current is more effectively suppressed because the conductivity of the hole injection layer—the acceptor concentration in this case—was reduced in both of the vicinity of the positive electrode and the vicinity of the hole transport layer, and that the conventional effects of improving the luminous intensity and the luminous efficiency and suppressing the operation voltage achieved by doping of the acceptor are retained

Example 4

Figure 6:
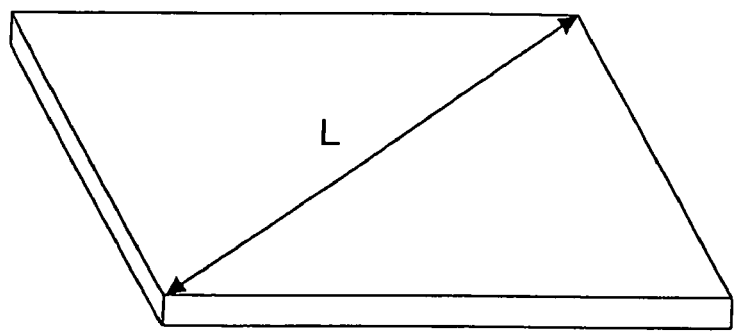
FIG. 6 is a perspective view schematically illustrating an organic EL display apparatus according to the invention.

Any of the organic EL elements shown in Examples 1 to 3 can be used for forming an organic EL display apparatus. FIG. 6 is a perspective view of an organic EL display apparatus 100A, which is an example of the organic EL display apparatus according to Example 4 of the invention.

The organic EL display apparatus according to this example has a diagonal line length (screen size) of, for example, 3.5 inches, and can be manufactured by a usual manufacturing method for a organic EL display apparatus. The wiring system and the controlling device of the organic EL display apparatus may be the same as those used in usual organic EL display apparatuses.

The organic EL display apparatus according to this example has characteristics in that the power consumption is small due to high luminous intensity, high luminous efficiency, and low operation voltage and the operating life thereof is long because of the low operation voltage.

The organic EL display apparatus according to this example also has effects of suppressing the generation of crosstalk because the leak current with respect to a negative voltage is suppressed in the organic EL element.

Example 5

The organic thin-film layers of the organic EL elements shown in Examples 1 to 3, such as the luminescent layer, the electron injection transport layer, the hole transport layer, and the hole injection layer, are formed by a vacuum deposition method as described above.

Figure 7:
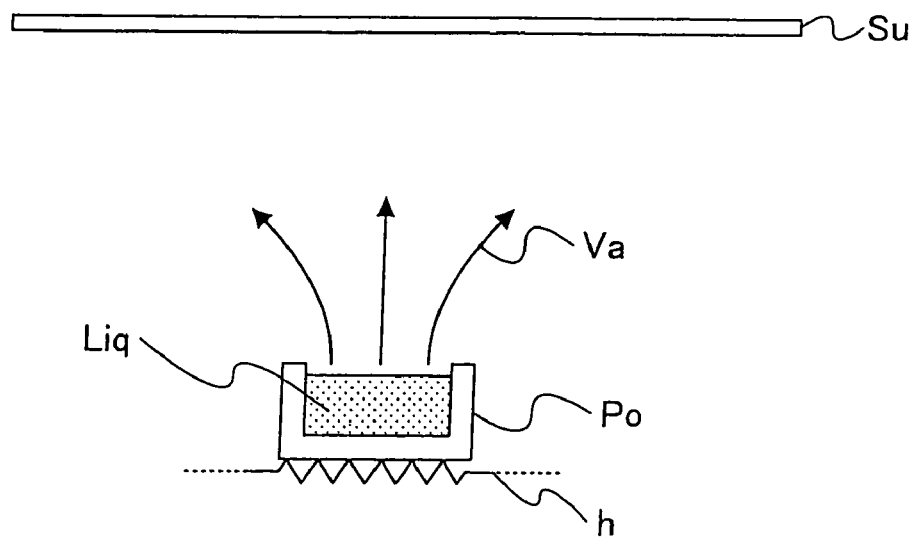
FIG. 7 is a schematic diagram of an organic layer deposition method for the formation of an organic EL element.

FIG. 7 schematically shows a part of a conventional vacuum deposition apparatus. Referring to FIG. 7, the conventional vacuum deposition apparatus has such a structure that an deposition source P0 retaining a material Liq and provided in a vacuum vessel (not shown) is heated by, for example, a high electric resistance heating unit h to thereby evaporate or sublimate the material and deposit the material on a substrate Su to be processed.

In the case of forming the organic EL element using the vacuum deposition method as described, it is important to improve the yield by suppressing the variation among the products. The conventional vacuum deposition apparatus has had problems in that the resulting film thickness and composition have largely variations. When controlling the deposition speed, for example, the control of the deposition speed, i.e., the thickness of the resultant film was inferior because the rate of the temperature control by the control of resistance heating was slow.

In Examples 1 to 3 described above, the conductivity of the hole injection layer is continuously changed so as to control the conductivity. Therefore, it is necessary to attain a high reproducibility of the thickness of the produced film and a high reproducibility of the concentration of the material added for changing the conductivity. However, it has been difficult to satisfy such necessities with a conventional apparatus.

Further, it has been difficult to laminate organic films of different types, for example, as shown in the organic EL element of FIG. 2.

When controlling the concentration gradient within the film by the current applied to the heating unit of the deposition source as disclosed in JP-A No. 2001-23776, the deposition speed is unstable, and a sufficient controllability cannot be obtained.

For example, JP-A No. 2003-77662 proposes a method of forming a film having a concentration gradient of an additive added to the film by moving a substrate above plural fixed deposition sources. However, the manufacturing apparatus itself is very large and expensive when the method is adopted.

This example describes an organic EL manufacturing apparatus capable of attaining a high controllability and reproducibility of the thickness of the produced film and a superior controllability and reproducibility of the concentration gradient of the additives and materials contained in the film, which solves the problems of the conventional vacuum deposition apparatus.

Figure 8:
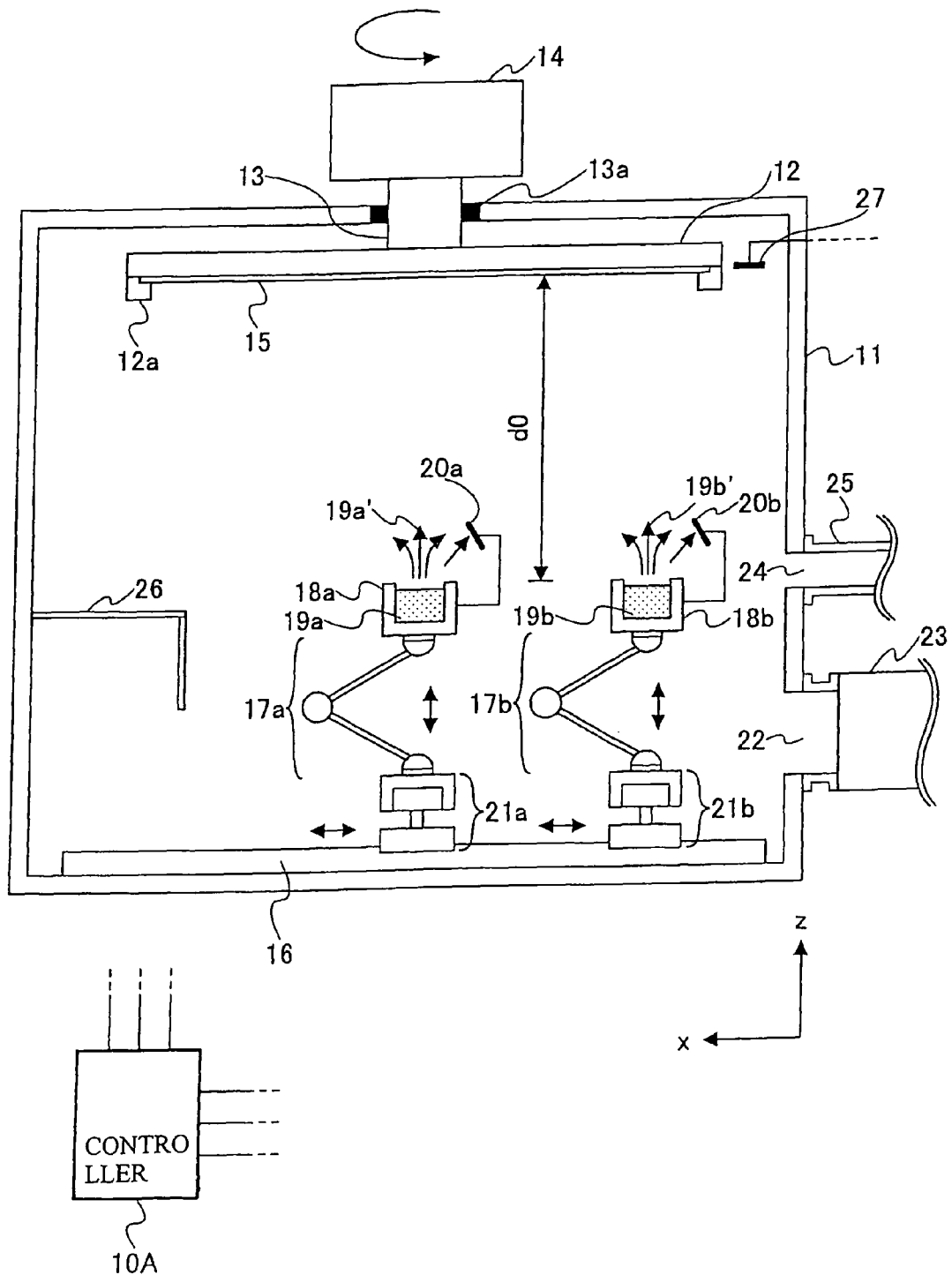
FIG. 8 is a sectional view schematically illustrating an apparatus for manufacturing an organic EL element according to the invention.

FIG. 8 schematically illustrates a vacuum deposition apparatus 10, which is an organic EL manufacturing apparatus according to this example.

Referring to FIG. 8, the vacuum deposition apparatus 10 comprises, inside a processing vessel 11, an deposition source 18a for retaining and vaporizing a material 19a and an deposition source 19b for retaining and vaporizing a material 19b inside a processing vessel 11, and has such a structure that the vaporized materials are deposited on a substrate 15 to be processed retained on a retaining table 15 with a retaining member 12a.

The processing vessel 11 has a first exhaust outlet 24, and a roughing line 25 is connected to the first exhaust outlet 24. The inside of the processing vessel 11 is evacuated by an exhaust unit not shown, for example, a dry pump.

The processing vessel 11 further comprise a second exhaust outlet 22, and a high vacuum pump (e.g., a cryopump, which is a pump of adsorption type) is connected to the second exhaust outlet so that the processing vessel 11 can be kept in a high vacuum state.

The retaining table 12 is supported by a supporting part 13 having, for example, a substantially cylindrical shape, and the space between the supporting part 13 and the processing vessel 11a is filled in with, for example, magnetic fluid. The supporting part 13 is connected to a pivoting mechanism 14, and the retaining table 12 is pivoted by the pivoting mechanism 14 via the supporting part 13. When the substrate 15 to be processed is pivoted by the retaining table 12, the thickness of the film deposited on the substrate 15 to be processed can effectively attain a favorable uniformity. A detecting unit 27 for detecting the thickness of the deposited film is provided in vicinity of the retaining table 12.

The material 19a retained by the deposition source 18a is heated by a heating unit (not shown) provided in the processing vessel 18a and thereby evaporated or sublimated to be finally vaporized. A vaporized material 19a' thereby obtained is deposited on the substrate 15 to be processed. In a similar manner, the material 19b retained by the deposition source 18b is heated by a heating unit (not shown) provided in the processing vessel 18b to be finally vaporized. A vaporized material 19b' thereby obtained is deposited on the substrate 15 to be processed.

The deposition source 18a is supported by a moving unit 17a comprising a vertically moving mechanism such as a multijoint arm. The deposition source 18a is vertically movable by the moving unit 17a, that is, in a direction substantially parallel to the direction from the side provided with the deposition source 18a toward the side provided with the retaining table 15 in the processing vessel 11, in other words, in a direction along which the deposition source 18a approaches or recedes from the substrate 15 to be processed (this direction is referred to as z-axis direction in the drawing).

In a similar manner, the deposition source 18b is supported by a moving unit 17b comprising a vertically moving mechanism such as a multijoint art, and is vertically movable by the moving unit 17b, that is, in the z-axis direction.

In this manner, because the deposition sources for vaporizing the materials for film formation are movable, the amounts of the vaporized materials that reach the substrate and are deposited on the substrate are quickly controlled so that a thin film can be formed on the substrate to be processed with a high reproducibility.

For example, the deposition speed and the thickness of the produced film have been controlled conventionally by the temperature adjustment conducted by the heating unit of the deposition source. Therefore, there was a limitation in control speed, and it has been difficult to attain a high reproducibility of the film thickness due to unstable factors such as bumping.

In this example, the deposition speed can be speedily controlled by the moving unit 17a. Therefore, the thickness of the produced thin film can be controlled well with high reproducibility.

In the foregoing constitution, the reproducibility of the thickness of the produced film is favorable owing to the presence of the detecting unit 20a which is provided in the deposition source 18a, and is moved together with the deposition source 18a by the moving unit 17a, and maintains a constant distance from the deposition source 17a, and measures the amount of the material vaporized from the deposition unit 18a.

The detecting unit 20a is a measuring unit that detects the amount of the material vaporized from the deposition source 18a. In the case of maintaining the deposition speed constant, for example, a distance d0 between the deposition source 18a and the substrate 15 to be processed is controlled to be large by the moving unit 17a when the amount of the material vaporized from the deposition source 18a is increased. The distance d0 is controlled to be small by the moving unit 17a when the amount of the material vaporized from the deposition source 18a is reduced.

The signal detected by the detecting unit 20a is transmitted to a controller 10A, and the moving unit 17a is controlled by the controller 10A in accordance with the signal, so that the distance d0 is controlled. The controller 10A functions to execute such control operations of the vacuum deposition apparatus 10 relating to the deposition as control of the pivoting of the retaining table, control of the heating unit, and control based on the detecting unit 27.

Therefore, the distance d0 can be speedily controlled even when the vaporization of the material is unstable so that the controllability of the deposition speed is favorable. As a result, the reproducibility of the thickness of the formed thin film can be favorable.

Further, the deposition source 18b comprises the moving unit 17b and a detecting unit 20b in a manner similar to the deposition unit 18a. The moving unit 17b and the detecting unit 20b which exert similar effects to those of the moving unit 17a and the detecting unit 20a in the deposition source 18a.

In the foregoing constitution, films having different compositions can be formed by use of plural deposition sources. Further, various concentration gradients can be realized with high controllability and high reproducibility.

Assuming a case where the material (or additive or the like) 19b is mixed with or added to the thin film formed from the material 19a, the deposition source 18a or 18b is moved by the moving unit 17a or 17b after the start of the deposition as necessary in this example. As a result, the ratio of the material 19b to the material 19a added to the thin film to be produced can be controlled, and the concentration gradient can be provided in the film-thickness direction.

Figures 9, 10A, 10B:
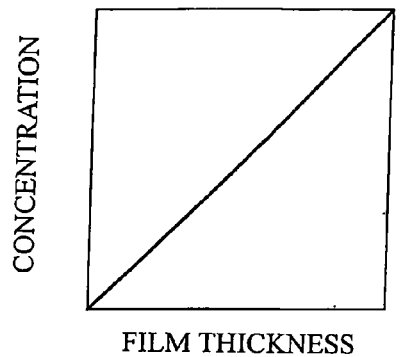
FIG. 9 shows the concentration of the component introduced into the organic layer formed by the manufacturing apparatus shown in FIG. 8.
FIGS. 10A and 10B show results obtained by examining the luminous intensity of an organic EL element manufactured by the manufacturing apparatus shown in FIG. 8 and a variation generated in the half-life period of the luminous intensity.

For example, FIG. 9 shows an example of the component of the thin film formed by the vacuum deposition apparatus 10 according to this example, wherein the ratio of the material 19b added to the material 19a is shown.

Referring to FIG. 9, the concentration of the material 19b is increased in accordance along the film-thickness direction of the produced thin film. Thus, the film having such a concentration gradient can be formed when the distance between the substrate 15 to be processed and the deposition source 18b is controlled to be reduced by the moving unit 17b as the deposition process advances.

In this case, the deposition source 18a may be controlled to recede from the substrate to be processed, or the control can be conducted such that the deposition sources 18b and 18a both are moved.

As described above, the film having the concentration gradient of the added material, which has conventionally been difficult to form, can be formed with high controllability and high reproducibility. Further, not only the concentration gradient of the added material but also the film thickness can be obtained with high controllability and high reproducibility because the deposition speed is controlled by the detecting units 20a and 20b and the controller 10A.

The moving unit 17a and 17b are fixed on moving unit 21a and 21b, respectively. The moving unit 21a and 21b are configured to move in a sliding manner on a slide receiver 16 that substantially has a rail shape and is provided at the bottom part of the processing vessel 10, thereby being capable of moving the deposition sources 18a and 18b in a direction substantially parallel to the substrate to be processed.

The movements of the moving unit 21a and the moving unit 21b are controlled by the controller 10A.

Because the deposition sources 18a and 18b are thus configured to move in the direction substantially parallel to the substrate to be processed (x-axis direction in the drawing), the controllability for achieving excellent deposition speed and excellent uniformity of the deposition speed within the surface of the substrate to be processed can be favorable. Further, a variation of the control of the concentration of the added material is broadened, which effectively improves the controllability.

A deposition intercepting unit 26 having a cabinet shape with an opening is provided in the processing vessel 11. When the deposition source 18a or 18b is moved to inside of the deposition intercepting unit 26, the rate of the deposition of the material vaporized from the deposition source 18a or 18b on the substrate to be processed can be quickly reduced. Thereby, the controllability is favorable, for example, in the case of depositing the thin films formed from different materials or in the case of providing the various concentration gradients described later referring to FIGS. 13A to 13L. The shape of the deposition control unit is not limited to the cabinet shape and can be arbitrarily determined as far as the material vaporized from the deposition source can be intercepted. For example, a shutter having a plate shape or a disc shape can be used.

The vacuum deposition apparatus according to this example can manufacture the organic EL element having the multi-layer structure comprising the organic films as shown in FIG. 2 with high reproducibility and high yield.

In particular, the favorable controllability and reproducibility of the acceptor concentration in the hole injection layer, which are shown in FIGS. 4A to 4C, are effectively attained, and further, the concentration gradients of the acceptors at the boarders g1, g2, g3 and g4 can easily be set at desirable values. In the case where the concentration gradient, which shows the change in the acceptor concentration, does not change drastically but changes continuously showing the moderate gradient at each of the boundaries g1 to g4, the life of the organic EL element can be improved. Therefore, such a moderate concentration gradient can be attained so as to form an organic EL element having an improved life.

Next, the reproducibility of the film thickness was confirmed with the vacuum deposition apparatus according to this example. The constitution of the produced organic EL element is ITO/NPD to Alq3 (150 nm)/LiF (0.5 nm)/Al (100 nm). The gradient of the concentration of Alq relative to NPD was generated as shown in FIG. 9. The molecular formulas of NPD and Alq will be described later. The element was formed as follows.

First, a glass substrate provided with an ITO electrode having the size of 200×200 mm was supersonically cleaned with pure water, acetone, pure water and isopropyl alcohol in this order for 15 minutes each and subjected to a UV-ozone cleaning. Then, the substrate to be processed was placed on the retaining table as shown in FIG. 8. The rotation speed of the retaining table was set at 10 rpm.

NPD was placed in the deposition source 18a, and Alq3 was placed in the deposition source 18b. When the current value to be applied to the heater of the heating unit, the temperature and the vaporization speed of the material were stabilized, the deposition started.

When the deposition started, the deposition source 18b was placed inside the deposition intercepting unit 26, and the deposition source 18a was controlled by the moving unit 17a to be placed at a position where the deposition speed of α-NPD detected by the detecting unit 27 was 0.1 nm/s.

Next, the deposition unit 18b was moved out of the deposition intercepting unit 26 so that the deposition of Alq3 was started. The controller 10A exerted control such that the deposition source 18b was brought to the proximity of the substrate to be processed by the moving unit 17b and such that the deposition source 18a was moved away from the substrate to be processed by the moving unit 17a, so as to achieve a predetermined concentration gradient.

The deposition speed was controlled at 0.1 nm/s by the detecting unit 27. Variable factors such as deposition speed influenced by the variation of the vaporizing state of the material are detected by the detecting unit 20a and 20b and reflected on the moving speeds of the moving unit 17a and 17b so that the deposition speed was not affected by the variation of the vaporizing state of the material.

When the deposition was completed, the deposition source 18a was controlled to be placed at a retreated position inside the deposition intercepting unit 26.

Next, after the LiF layer was formed to a thickness of 0.5 nm, Al was deposited to a thickness of 100 nm, and the glass substrate was bonded thereto with a UV hardening adhesive so that an organic EL element was formed.

The foregoing organic EL element was formed five times in order to confirm the reproducibility, and the luminous intensity and the half-life period of the element at the current density of 10 mA/cm$^2$ were measured. The result are shown in FIG. 10B. FIG. 10A shows the comparative results obtained with an organic EL element produced by controlling the deposition speed by the temperature of the heating unit (i.e., the current value of the heater of the heating unit) under a similar control operation to the conventional apparatus without moving the deposition source. The variation was calculated based on the average value of the results of the five evaluations.

Referring to FIGS. 10A and 10B, it was confirmed that when the film-forming rate and the components in the film are controlled by control of the position of the deposition source 18a or 18b using the vacuum deposition apparatus according to this example, excellent reproducibility of the luminous intensity and the life, smaller variation, and high yield of the product can be achieved.

Further, the vacuum deposition apparatus according to this example can be suitably used for research and development or inspection of the organic films of the organic EL element as described below, and serves to effectively implement the research and development or the evaluation in a reduced time period.

The luminous efficiency and the life of the organic EL element largely change depending on the element structure, for example, the film thickness of each of the laminated films and the dope concentration. Therefore, it is necessary to check if the film thickness and the dope concentration are appropriate. In conventional deposition apparatuses, it has been necessary to repeat the deposition using a shadow mask, and the deposition process was therefore time consuming.

In the deposition apparatus according to this example, a film having a dope concentration gradient can be easily formed in one deposition process, and a thin film for the evaluation of the dope concentration, for example, can be completed in one deposition process.

In order to evaluate the dope concentration, the following organic EL element was formed.

ITO/2-TNATA (40 nm)/α-NPD (10 nm)/CBP+x % (forming a concentration gradient) tbppy (20 nm)/BCP (10 nm)/Alq3 (20 nm)/LiF (0.5 nm)/Al (100 nm)

The molecular formulas of 2-TNATA, tbppy, CBP and BCP will be recited later.

Figure 11:
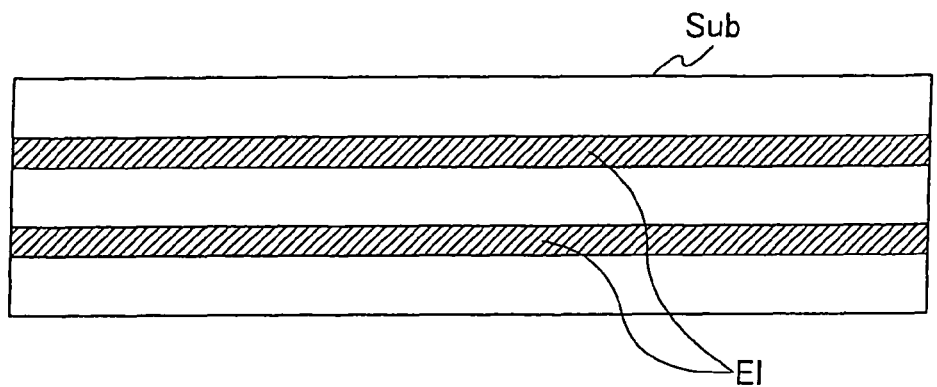
FIG. 11 is a schematic diagram of an example of the substrate in the case where an organic EL element is manufactured by the manufacturing apparatus shown in FIG. 8.
Figure 12:
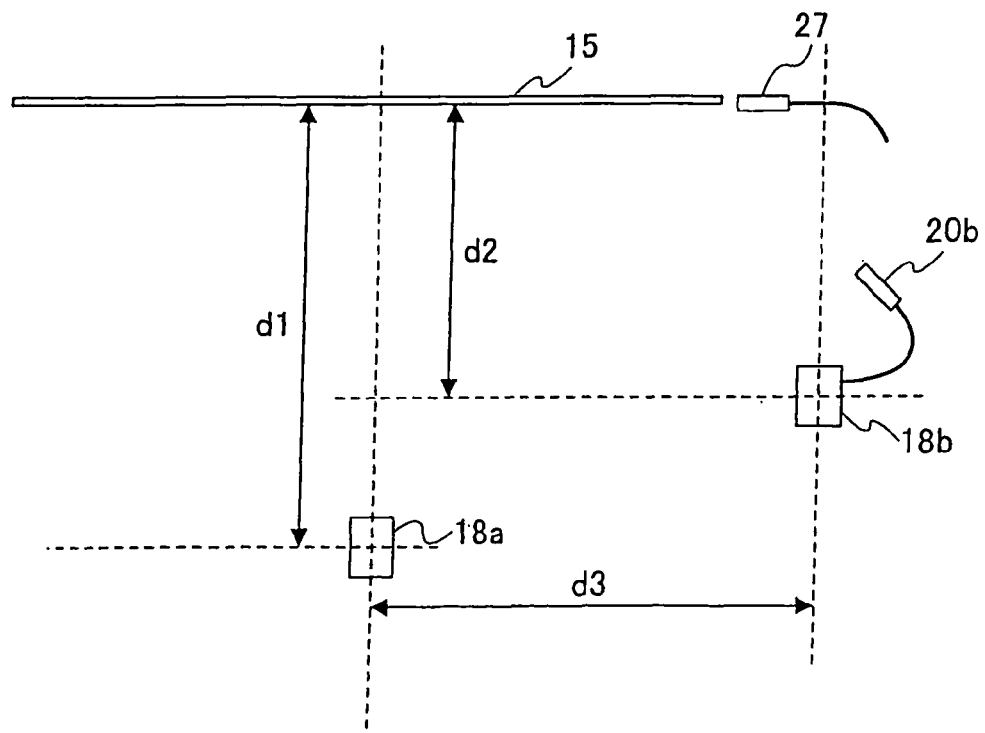
FIG. 12 shows an example of a positional relationship between the substrate to be processed and the deposition source in the case where an organic EL element is manufactured by the manufacturing apparatus shown in FIG. 8.
Figure 13A:
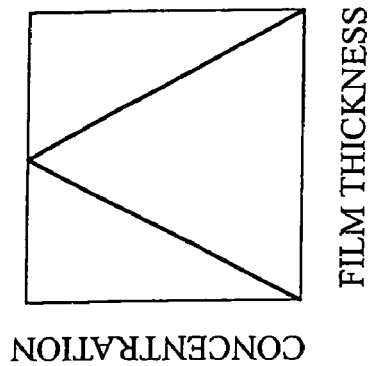
FIGS. 13A to 13L show examples of the state of the concentration of the component introduced into the organic layer formed by the manufacturing apparatus shown in FIG. 8.
Figure 13B:
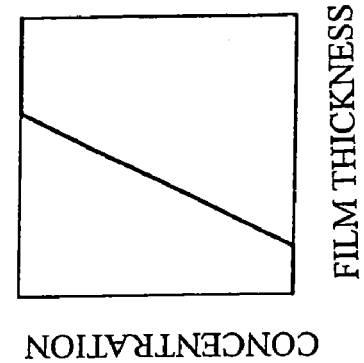
Figure 13C:
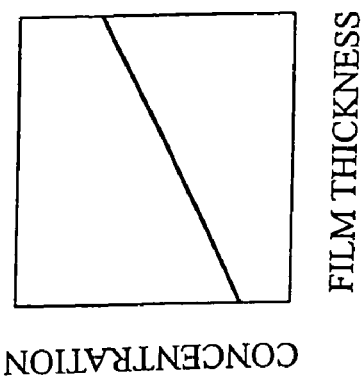
Figure 13D:
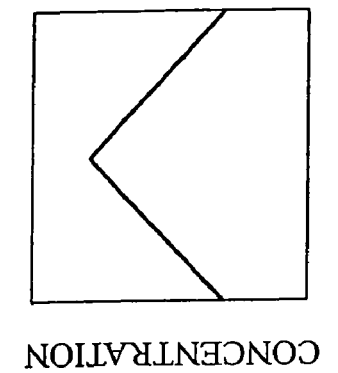
Figure 13E:
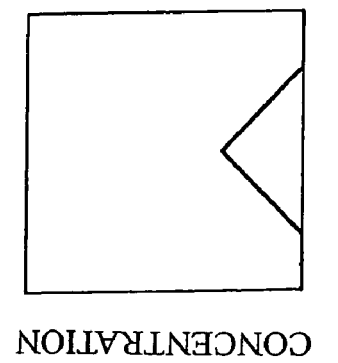
Figure 13F:
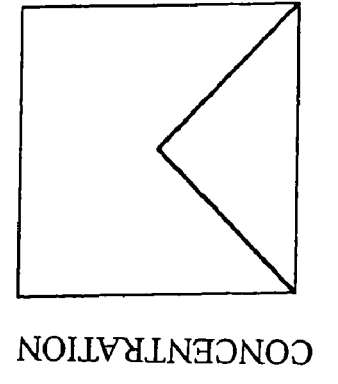
Figure 13I:
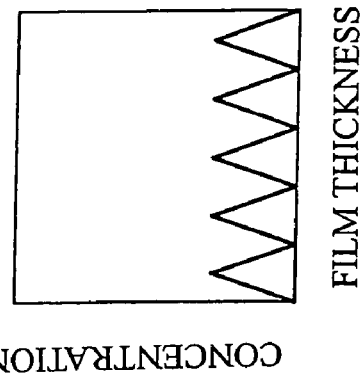
Figure 13L:
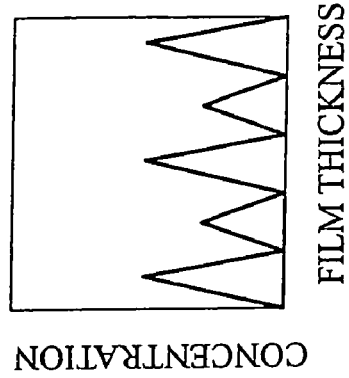
Figure 13H:
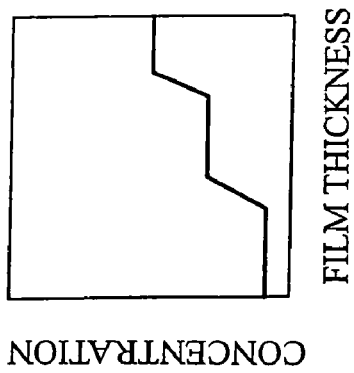
Figure 13K:
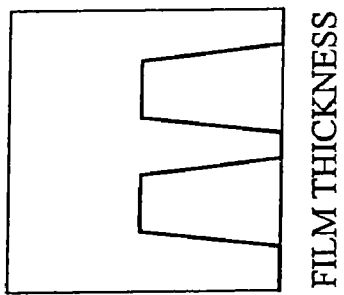
Figure 13G:
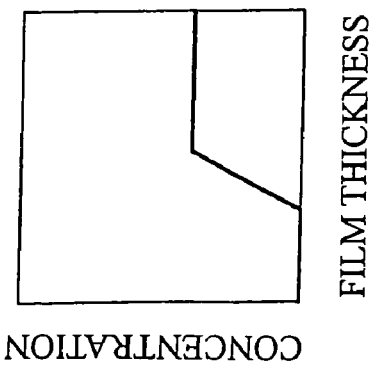
Figure 13J:
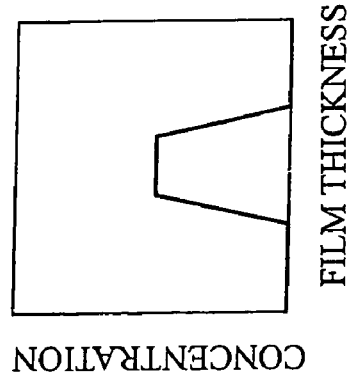
Figure 14A:
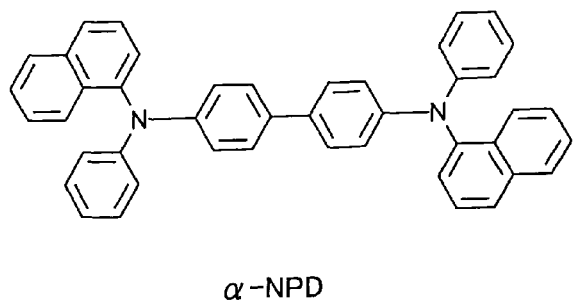
FIGS. 14A to 14F show examples of the molecular formula of a deposition material usable in the manufacturing apparatus shown in FIG. 8.
Figure 14B:
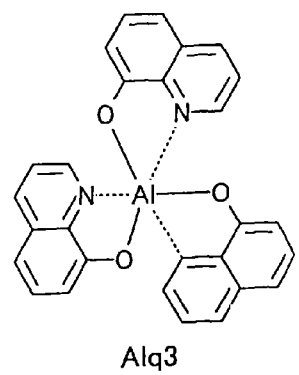
Figure 14C:
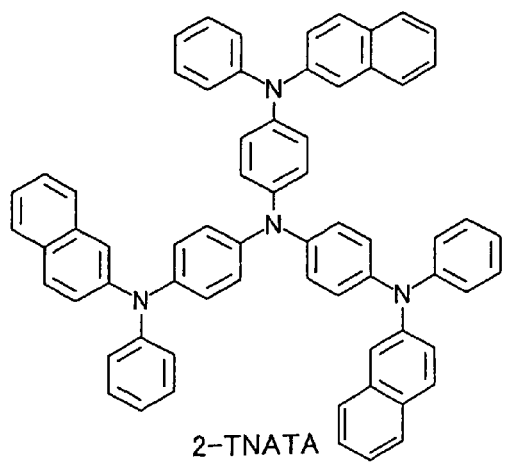
Figure 14D:
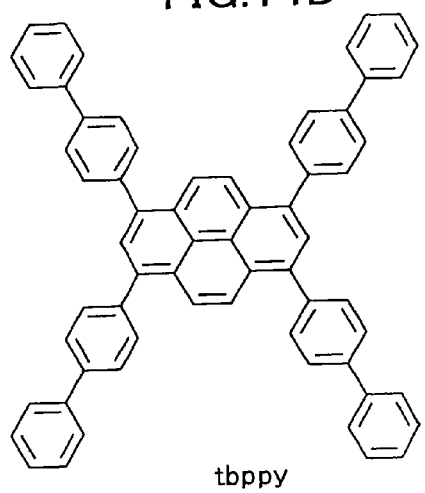
Figure 14E:
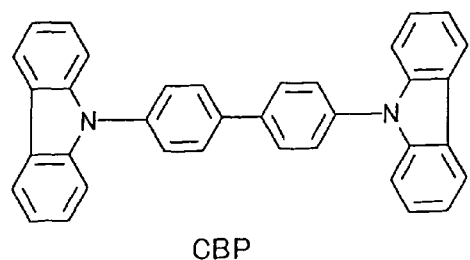
Figure 14F:
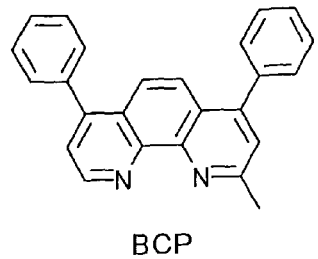

Film formation was conducted on a substrate Sub on which ITO electrodes E are formed shown in FIG. 11, and the deposition sources 18a and 18b were placed as shown in FIG. 12. In the drawing, the parts that have been already described above are represented by the same reference characters, and descriptions thereof are omitted.

A distance d1 between the substrate to be processed and the processing vessel 18a in the case of forming the luminescent layer (CBP+x % (forming a concentration gradient) tbppy) was 60 cm, a distance d2 between the substrate to be processed and the processing vessel 18b was 35 cm, and a distance d3 between the processing vessel 18a and the processing vessel 18b in a direction parallel to the substrate to be processed was 30 cm. The position of the deposition source 18b in which tbppy as a dope material was retained was set such that the ratio of the film forming rate of tbppy between the position with the fastest film forming rate on the substrate to be processed and the position with the slowest film forming rate on the substrate to be processed was 20:1.

2-TNATA as the hole injection layer was uniformly deposited to a thickness of 40 nm, and α-NPD as the hole transport layer was uniformly deposited to a thickness of 10 nm on the substrate. The luminescent layer was formed by placing tbppy as the dope material in the deposition source 18b, placing CBP as the host material in the deposition source 18a, and forming the film while controlling the position of the processing vessel such that the dope concentration on the substrate at the closest position to the deposition source 18b was 20 wt %, and such that the dope concentration continuously varied within the luminescent layer on the substrate.

Thereafter, a BCB layer was formed to a thickness of 10 nm, and an Alq layer was formed to a thickness of 20 nm. Then, a LiF/AL electrode having a width of 1 mm, which acts as a cathode in a band shape and orthogonally intersects with an anode, was formed using a shadow mask.

As a result of evaluation of the luminous efficiency and the life of the produced element, it was found that the luminous efficiency was optimum at the dope concentration of 12%, and the life of the element was maximized at the dope concentration of 9%. As described, when the vacuum deposition apparatus according to this example is used, the evaluation of the dope concentration of the luminescent layer, which conventionally required a plurality of film formations, can be completed in a single film formation.

FIGS. 13A to 13L show examples of the shape of the concentration gradient of the dope material which can be formed by the vacuum deposition apparatus according to this example. Thin films having such various concentration gradients can be formed with a high reproducibility.

Next, FIGS. 14A to 14F show examples of the molecular formulas of materials usable for the deposition with the vacuum deposition apparatus according to this example.

Alq3 denotes tris(8-hydroxyquinoline)aluminium, tbppy denotes 1,3.6,8-tetrakis-biphenyl-4-yl-pyrene, CBP denotes 4.4'-N-N'-dicarbazole-biphenyl, and BCP denotes Bathocuproine. These materials are merely examples, and thin films having necessary concentration gradients can be formed with the deposition apparatus according to the example using various materials as necessary.

The organic EL element according to the invention can be used as a display apparatus such as a flat panel display, as well as a low power consumption light source.

Preferred examples of the present invention are described above. It should be understood that the present invention is not limited to the above-described specific examples, and that various modifications or changes may be made without departing from the concept described in the claims.

INDUSTRIAL APPLICABILITY

According to the present invention, the leak current of an organic EL element can be suppressed while the conductivity of the organic EL element is improved and the operation voltage thereof is suppressed. As a result, crosstalk of the organic EL display apparatus can be reduced.

What is claimed is:

1. An organic EL element comprising, between a positive electrode and a negative electrode, at least a luminescent layer, a hole transport layer adjacent to a positive-electrode side of the luminescent layer, and an electron injection transport layer adjacent to a negative-electrode side of the luminescent layer,
wherein a hole injection layer is provided between the hole transport layer and the positive electrode, and the conductivity of the hole injection layer continuously changes along the thickness direction of the hole injection layer,
wherein the hole injection layer includes an acceptor, and
wherein the hole injector layer has a border region with a reduced acceptor concentration formed in the vicinity of an interface between the hole injection layer and the positive electrode, and the acceptor concentration in the hole injection layer changes by at least 10% in the vicinity of the interface.

2. The organic EL element as described in claim 1, wherein the concentration of the acceptor in the hole injection layer changes continuously along the thickness direction of the hole injection layer.

3. The organic EL element as described in claim 1, wherein the hole injection layer has a border region with a reduced acceptor concentration formed in the vicinity of an interface between the hole injection layer and the hole transport layer.

4. The organic EL element as described in claim 1, wherein the hole injection layer comprises 4,4',4"-tris(2-naphthylphenylamino)triphenylamine, and the acceptor comprises 2,3,5,6-tetrafluoro-7,7,8,8tetracyanoquinodimethane.

5. The organic EL element as described in claim 1, wherein the positive electrode comprises a conductive oxide, and the hole injection layer has a film thickness of 40 to 50 rim.

6. An organic EL display apparatus comprising the organic EL element of claim 1 comprising, between a positive electrode and a negative electrode, at least a luminescent layer, a hole transport layer adjacent to a positive-electrode side of the luminescent layer, and an electron injection transport layer adjacent to a negative-electrode side of the luminescent layer, wherein
a hole injection layer is provided between the hole transport layer and the positive electrode, and the conductivity of the hole injection layer continuously changes along the thickness direction of the hole injection layer.

7. A method of manufacturing an organic EL element as described in claim 1, said method comprising:
a step of forming a hole injection layer on a positive electrode provided on a substrate;
a step of forming a hole transport layer on the hole injection layer;
a step of forming a luminescent layer on the hole transport layer;
a step of forming an electron injection transport layer on the luminescent layer; and
a step of forming a negative electrode on the electron injection transport layer,
wherein the step of forming the hole injection layer is conducted by a vacuum deposition method using a deposition source, and the step of forming the hole injection layer includes a step of changing a distance between the deposition source and the substrate to be processed on which the organic EL element is to be provided.

8. The method of manufacturing an organic EL element as described in claim 7, wherein an acceptor is introduced into the hole injection layer during the step of forming the hole injection layer, and the concentration of the acceptor in the hole injection layer is changed along a film thickness direction of the hole injection layer during the step of changing the distance from the deposition source.

9. The method of manufacturing an organic EL element as described in claim 8, wherein the change in the acceptor concentration along the film-thickness direction is an increase in the acceptor concentration.

10. The method of manufacturing an organic EL element as described in claim 8, wherein the change in the acceptor concentration along the film-thickness direction is a decrease in the acceptor concentration.

11. The method of manufacturing an organic EL element as described in claim 8, wherein the deposition source is a plurality of deposition sources, and the acceptor is retained in at least one of the plurality of deposition sources.

12. The method of manufacturing an organic EL element as described in claim 8, wherein a conductivity of the hole injection layer is changed in accordance with the change in the concentration of the acceptor in the hole injection layer.

13. An apparatus for manufacturing an organic EL element as described in claim 1, said apparatus comprising:
- a processing vessel;
- an exhaust unit that exhausts air from the processing vessel;
- a retaining table that retains a substrate to be processed and is provided on a first side inside the processing vessel; and
- a deposition source that vaporizes a material and is provided on a second side inside the processing vessel facing the first side,
- wherein the material vaporized by the deposition source is deposited on the substrate to be processed, and the apparatus further comprises a moving unit that moves the vaporizing unit inside the processing vessel and is configured to move the deposition source at least in a direction from the first side toward the second side or in a direction from the second side toward the first side.

14. The apparatus for manufacturing an organic EL element as described in claim 13, further comprising a detecting unit that moves with the deposition source and detects an amount of the material vaporized from the deposition source while maintaining a constant distance from the deposition source.

15. The apparatus for manufacturing an organic EL element as described in claim 13, further comprising a control unit that controls a distance between the substrate to be processed and the deposition source using the moving unit in accordance with the amount of the material vaporized from deposition source detected by the detecting unit.

16. An organic EL element comprising, between a positive electrode and a negative electrode, at least a luminescent layer, a hole transport layer adjacent to a positive-electrode side of the luminescent layer, and an electron injection transport layer adjacent to the negative-electrode side of the luminescent layer,
- wherein a hole injection layer is provided between the hole transport layer and the positive electrode, and the conductivity of the hole injection layer continuously changes along the thickness direction of the hole injection layer,
- wherein the hole injection layer includes an acceptor, and
- wherein the hole injection layer has a border region with a reduced acceptor concentration formed in the vicinity of an interface between the hole injection layer and the hole transport layer, and the acceptor concentration in the hole injection layer changes by at least 10% in the vicinity of the interface.

17. An organic EL element comprising, between a positive electrode and a negative electrode, at least a luminescent layer, a hole transport layer adjacent to a positive-electrode side of the luminescent layer, and an electron injection transport layer adjacent to a negative-electrode side of the luminescent layer,
- wherein a hole injection layer is provided between the hole transport layer and the positive electrode, and the conductivity of the hole injection layer continuously changes along the thickness direction of the hole injection layer,
- wherein the hole injection layer includes an acceptor,
- wherein the hole injection layer has first and second border regions with reduced acceptor concentrations in the vicinity of an interface between the hole injection layer and the hole transport layer and in the vicinity of another interface between the hole injection layer and the positive electrode, respectively, and
- wherein the acceptor concentration in the hole injection layer changes by at least 10% in the vicinity of both interfaces.

* * * * *